US005287316A

United States Patent [19]

Urushidani et al.

[11] Patent Number: 5,287,316

[45] Date of Patent: Feb. 15, 1994

[54] OPTICAL FIFO BUFFER

[75] Inventors: Shigeo Urushidani, Hachioji; Koji Sasayama, Iruma; Jun Nishikido, Kodaira, all of Japan

[73] Assignee: Nippon Telegraph and Telephone Corporation, Tokyo, Japan

[21] Appl. No.: 705,387

[22] Filed: May 24, 1991

[30] Foreign Application Priority Data

May 25, 1990 [JP] Japan ................................ 2-136766

[51] Int. Cl.[5] ........................ G11C 19/30; G11C 13/04

[52] U.S. Cl. .................................... 365/215; 365/234; 365/64; 385/24

[58] Field of Search ........................ 365/72, 64, 76, 77, 365/73, 215, 234, 221; 385/14, 31, 32, 24

[56] References Cited

U.S. PATENT DOCUMENTS 4,479,701 10/1984 Newton et al. ........................ 385/24
4,778,239 10/1988 Shaw et al. ............................ 385/24
4,934,777 6/1990 Jou et al. .............................. 385/27
5,032,010 7/1991 Su .......................................... 385/24
5,058,060 10/1991 Su ......................................... 365/215

FOREIGN PATENT DOCUMENTS 0087252 2/1983 European Pat. Off. .
0353927 7/1989 European Pat. Off. .
2552916 9/1983 France .

OTHER PUBLICATIONS

Topical Meeting on Phototnic Switching, Mar. 18-20, 1987, Incline Village, Nev. Technical Digest Series, vol. 13.

Photonic Switching, Mar. 1-3, 1989, Salt Lake City, Utah, Optical Society of America.

*Primary Examiner*—Timothy P. Callahan
*Attorney, Agent, or Firm*—Finnegan, Henderson, Farabow, Garrett & Dunner

[57] ABSTRACT

A FIFO buffer in which respective portions are controlled in a distributed manner is provided. In the FIFO buffer, a number of loop circuits having delay elements are provided in which respective loop circuits are connected to one another in cascade manner. Additionally provided are a number of traffic control units for controlling the signal traffic between respective neighboring loop circuits. In the case where no signal is fed back to a traffic control unit from the output side and also a new signal is transmitted thereto from the input side, the traffic control unit transmits the new signal to the loop circuit which is on the output side. In the case where any signal is fed back to a traffic control unit from the output side and also a new signal is transmitted thereto from the input side, the traffic control unit again transmits the fed-back signal to the loop circuit which is on the output side and transmits the new signal to the loop circuit which is on the input side. In the case where any signal is fed back to a traffic control means from the output side and also no signal is transmitted thereto from the input side, the traffic control means transmits again the fed-back signal to the loop circuit which is on the output side.

7 Claims, 9 Drawing Sheets

FR1~FR4: FABRI-PERO RESONATOR

OPTICAL FIFO BUFFER

BACKGROUND OF THE INVENTION

Field of the Invention

The present invention relates to FIFO (First In First Out) buffers used for signal processing, and more particularly relates to the optical FIFO buffers used for optical signal processing, for example, optical computing, optical packet switching and the like.

Prior Art

Recently, optical technology has been introduced into signal processing performed in various fields, for example, communications, computing, packet switching and the like, the performance of which is thereby greatly improved.

In these signal processings, the case is often encountered in which a processing system cannot accept incoming signals continuously supplied from other devices connected thereto. In addition, a signal collision in which two different signals are simultaneously supplied to the same node may occur, whereby the functions to be achieved by the respective signals cannot be achieved. In order to prevent these problems, the input timing at which signals are supplied to the processing system must be controlled based on the current state of the processing system. For this reason, delay operations or buffering operations are used for various signal processing systems.

FIG. 12 shows an example of a conventional delay circuit using optical fiber delay lines. In FIG. 12, $CA_0$ through $CA_{n-1}$ respectively designate 2×2 optical couplers. To these 2×2 optical couplers $CA_0$ through $CA_{n-1}$, fiber delay lines $LA_0$ through $LA_{n-1}$ are respectively connected, wherein the fiber delay lines $LA_0$ through $LA_{n-1}$ respectively have propagation delay times $2^0T$ through $2^{n-1}T$ (T is a constant). In addition, to the 2×2 optical coupler $CA_0$ through $CA_{n-1}$, delay designation signals $X_0$ through $X_{n-1}$ are respectively supplied. In the case where the delay designation signal $X_i$ is active, a signal which comes into the 2×2 optical coupler $CA_i$ is delayed by passing through the fiber delay line $LA_i$, after which the delayed signal is outputted from the 2×2 optical coupler $CA_i$. In contrast, in the case where the delay designation signal $X_i$ is not active, a signal which comes into the 2×2 optical coupler $CA_i$ is directly outputted without passing through the fiber delay line $LA_i$. With this delay circuit, the input timing at which signals are supplied to the processing system can be controlled among $(2^n-1)T$ through 0 based on the delay designation signals $X_0$ through $X_{n-1}$.

By using a configuration similar to that shown in FIG. 12, a FIFO buffer can be constituted as shown in FIG. 13. In FIG. 13, $CB_0$ through $CB_{n-1}$ respectively designate 2×2 optical switches, wherein the 2×2 optical switches $CB_0$ through $CB_{n-1}$ are connected together in a cascade manner. To these 2×2 optical couplers $CB_0$ through $CB_{n-1}$, fiber delay lines $LB_0$ through $LB_{n-1}$ are respectively connected, wherein the fiber delay lines $LB_0$ through $LB_{n-1}$ have the same propagation delay time. Each 2×2 optical switch $CB_i$ and fiber delay line $LB_i$ connected therewith constitute a fiber loop memory for holding an optical signal which comes thereto. New incoming signals are sequentially supplied to the input terminal of the first stage 2×2 optical switch $CB_{n-1}$ which is inserted in the first stage fiber loop memory. The output signals are picked up from the last stage 2×2 optical switch $CB_0$ inserted in the last stage fiber loop memory, after the output signals are sequentially supplied to a device connected to the FIFO buffer. Hereinafter, a device which accepts the signals supplied from the FIFO buffer will be called a "continued device". A control unit (not shown) usually monitors the status of respective stage fiber loop memories and the status of the continued device. Based on the detected status, the control unit supplies traffic control signals $Y_0$ through $Y_{n-1}$ respectively to the 2×2 optical switches $CB_0$ through $CB_{n-1}$, whereby the input/output operation and holding operation of each fiber loop memory is controlled. By this control, the new incoming signal automatically propagates through the fiber loop memories which hold no signals, after which the incoming signal is automatically held in the fiber loop memory which is the nearest stage to the last stage and holds no signal. In addition, when the continued device can accept signals, the signal held in the last stage fiber loop memory is picked up from the 2×2 optical switch $CB_{n-1}$, after which the picked up signal is supplied to the continued device. In the above-described FIFO buffer, the operations of respective portions provided in the FIFO buffer are controlled by the control unit in an integrated manner, the signals are automatically held and pass through the FIFO buffer, after which the signals are supplied to the continued device at the preferable timing at which the continued device can accept and process the incoming signals. However, a problem occurs in that the timing control in which the control unit supplies the traffic control signals is extremely critical so that normal signal traffic cannot be obtained in the FIFO buffer without exact timing adjustment.

SUMMARY OF THE INVENTION

In consideration of the above-described disadvantages of conventional devices, an object of the present invention is to provide a FIFO buffer in which respective portions are controlled in a distributed manner and normal signal traffic can be obtained without exact timing adjustment.

In an implementation of the present invention, a FIFO buffer for holding signals and supplying held signals to a device connected thereto, said FIFO buffer comprising:

a number of loops for holding a signal introduced therein, wherein each loop includes a delay element, and the loops are connected to one another between an input portion and an output portion in a cascade manner; and a number of traffic control units for controlling the signal traffic between the loops, each traffic control units having an input side and an output side connected to the output portion and input portion of respective loops so that each of traffic control means is commonly included in two neighboring loops, the transmission function of each traffic control unit is controlled based on signals which come thereto, whereby in the case where no signal is fed back to the traffic control unit from the output side and a new signal is transmitted to the traffic control unit from the input side, the traffic control unit transmits the new signal to the loop which is on the output side; in the case where any signal is fed back to the traffic control unit from the output side and a new signal is transmitted to the traffic control unit from the input side, the traffic control means transmits the fedback signal to the loop which is on the output side again and transmits the new signal to the loop which is on the input side; and in the case where any signal is fed back to the traffic control unit from the output side and also no signal is transmitted to the traffic control unit from the input side, the traffic control unit transmits the fed-back signal to the loop which is on the output side again.

The preferred embodiments of the present invention are described in a following section with reference to the drawings, from which further objects and advantages of the present invention will become apparent.

DETAILED DESCRIPTION OF THE PREFERRED EMBODIMENTS

In the following section, the preferred embodiments of the present invention will be described in detail with reference to the drawings.

A. First Preferred Embodiment

Figure 1:
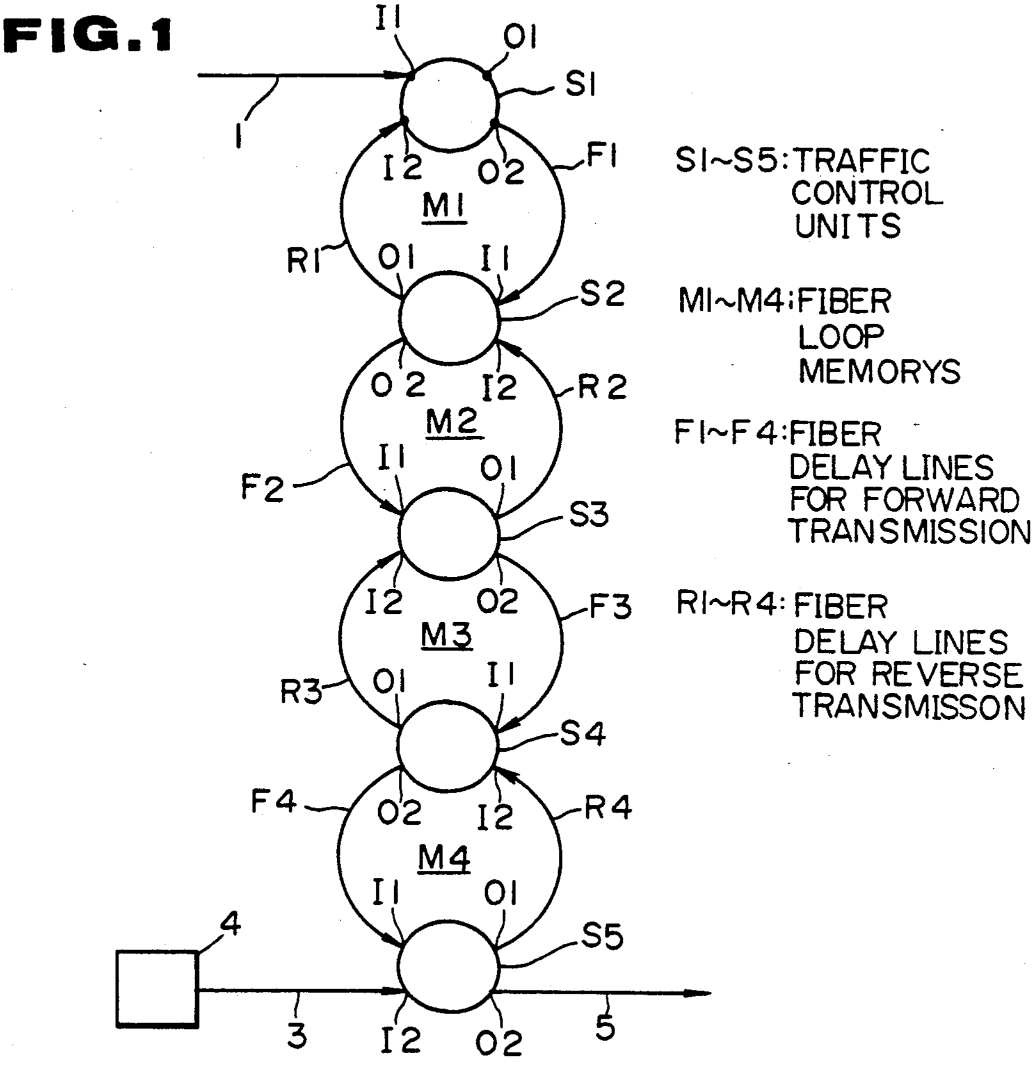
FIG. 1 is a block diagram showing the configuration of a FIFO buffer according to the first preferred embodiment of the present invention.

FIG. 1 is a block diagram showing the configuration of a FIFO buffer of a first preferred embodiment of the present invention. In FIG. 1, 1 designates an input signal line through which input signals are transmitted. F1 through F4 respectively designate fiber delay lines for transmitting optical signals in the forward direction, which directs the continued device (not shown), connected to the output terminal of the FIFO buffer, wherein the fiber delay lines F1 through F4 have the same propagation delay time D1. In addition, R1 through R4 respectively designate fiber delay lines for transmitting optical signals in the reverse direction, which directs the input terminal of the FIFO buffer, wherein the fiber delay lines R1 through R4 have the same propagation delay time D2. The values of D1 and D2 will be described later. S1 through S5 respectively designate traffic control units, wherein each traffic control unit has first and second input terminals I1 and I2, and also has first and second output terminals O1 and O2.

The input signal line 1 is connected to the first input terminal I1 of the first stage traffic control unit S1. No device is connected to the first output terminal O1 of the first stage traffic control unit. The second output terminal O2 of the first stage traffic control unit S1 is connected to the first input terminal I1 of the second stage traffic control unit S2 via the fiber delay line F1. The first output terminal O1 of the second stage traffic control unit S2 is connected to the second input terminal I1 of the first stage traffic control unit S1 via the fiber delay line R1. In this manner, two traffic control units S1 and S2 and two fiber delay lines F1 and R1 are connected together so as to form a closed loop. These elements S1, S2, F1, and R1 constitute the first stage fiber loop memory M1 for holding the incoming signals which come thereto via input line 1.

Next, the second output terminal O2 of the second stage traffic control unit S2 is connected to the first input terminal I1 of the third stage traffic control unit S3 via the fiber delay line F2. The first output terminal O1 of the third stage traffic control unit S3 is connected to the second input terminal I2 of the second stage traffic control unit S2 via the fiber delay line R2. Thus, in a manner similar to that of the first stage, two traffic control units S2 and S3 and two fiber delay lines F2 and R2 constitute the second stage fiber loop memory M2 for holding the signals which come thereto from the first stage fiber loop memory M1. Similarly, in the respective stages following the second stage, respective elements are connected together in the same connection manner as described above, whereby the third stage through last stage (in the case shown in FIG. 1, the last stage is the fourth stage) fiber loop memories M3 and M4 are constituted.

An output terminal of control unit 4 is connected to the second input terminal I2 of the last stage traffic control unit S5 inserted in last stage fiber loop memory M4 via a control line 3. The second output terminal O2 of the last stage traffic control unit S5 is connected to the continued device via an output line 5, wherein the continued device processes input data supplied through this FIFO buffer. The control unit 4 monitors the state of the continued device, and judges whether or not the continued device can accept and process signals. When the result of this judgement is No, the control unit 4 supplies a wait signal to the last stage traffic control unit S5, whereby the connection configuration of the last stage traffic control unit S5 is set to the connection configuration corresponding to the hold operation so that the last stage fiber loop memory M4 hold signals. In contrast, if the result of the judgement described above is Yes, the wait signal is not supplied to the last stage 2×2 optical switch S5, whereby the output signal is picked up from the last stage traffic control unit S5 and supplied to the continued device.

Figure 2:
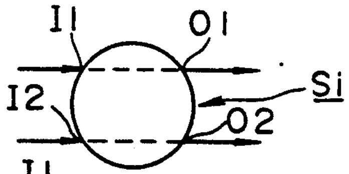
FIGS. 2(*a*) through 2(*c*) show the functions of a traffic control unit used for the FIFO buffer shown in FIG. 1.
Figure 2:
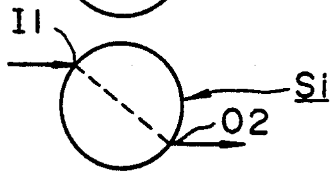
Figure 2:
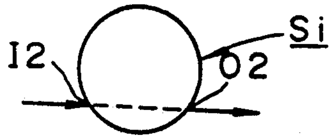

The 2×2 optical switches S1 through S5 are provided in order to control the optical signal traffic between neighboring fiber loop memories. In the following, the function of each traffic control unit will be described with reference to FIGS. 2(*a*) through 2(*c*). In this traffic control unit, the connection configuration between the input terminals I1 and I2 and the output terminals O1 and O2 is switched based on the operational status of the input terminals I1 and I2. In the case where two signals are simultaneously supplied to the first and second input terminals I1 and I2, i.e., in the case where a fiber loop memory already holds a signal which has just come in, and a new signal comes into the traffic control unit which is inserted in the fiber loop memory, the connection configuration of the traffic control unit is set to the state corresponding to the parallel transmission function as shown in FIG. 2(*a*), whereby the signal entered into the first input terminal I1 is transmitted to the first output terminal O1 and the signal entered into the second input terminal I2 is transmitted to the second output terminal O2. As a result, the signal entered into the first input terminal is fed back to the neighboring stage traffic control unit in the reverse direction, and also the signal entered into the second input terminal is again transmitted to the next stage traffic control unit, whereby the holding operations are executed in two fiber loop memories connected thereto.

In the case where a fiber loop memory holds no signal and a new signal comes into the first input terminal I1 of the traffic control unit inserted in the fiber loop memory, the connection configuration of the traffic control unit is set to the state corresponding to the cross transmission function as shown in FIG. 2(*b*), whereby the signal entered into the first input terminal I1 is transmitted to the second output terminal O2. As a result, the incoming signal supplied to the first input terminal I1 is transmitted to the first input terminal I1 of the next stage 2×2 optical switch.

In the case where a signal is entered into the second input terminal I2, the entered signal is transmitted to the second output terminal O2 as shown in FIG. 2(*c*). As a result, the signal circulates in the fiber loop memory which is formed by the traffic control unit, the next stage traffic control unit, and two fiber delay lines, whereby the hold operation for the signal is maintained.

The last stage traffic control unit S5 does not receive the input signal from the next stage, but instead receives the wait signal supplied from the control unit 4. The control unit 4 outputs the wait signal when the continued device connected to this FIFO buffer cannot accept and process signals. In the case where any signal is supplied to the first input terminal I1 and the wait signal is supplied to the second input terminal I2, i.e., in the case where the signal to be sent comes thereto and the continued device cannot receive the signal, the connection configuration of the traffic control unit S5 is set to the state corresponding to the parallel transmission function, whereby the new incoming signal to be sent is held in the last stage fiber loop memory M4. In the case where any signal is supplied to the first input terminal I1 and the wait signal is not supplied to the second input terminal I2, the connection configuration of the traffic control unit S5 is set to the state corresponding to the cross transmission function, whereby the new incoming signal is supplied to the continued device.

Figure 3:
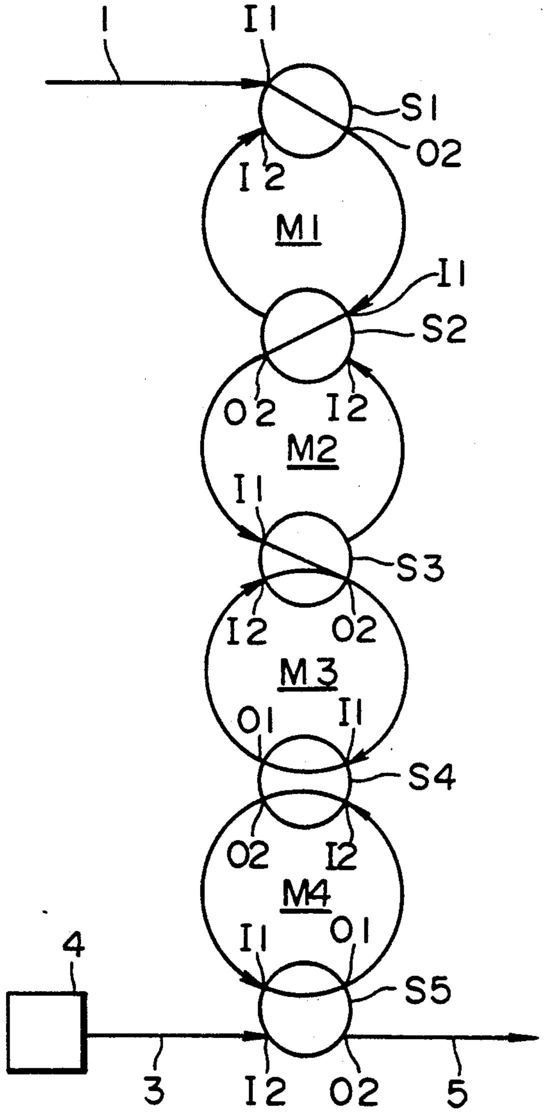
FIG. 3 shows an operation example of the FIFO buffer shown in FIG. 1.

Hereinafter, the operation of the FIFO buffer shown in FIG. 1 will be described. FIG. 3 shows the operation of the FIFO buffer in the case where the circulation of the signal which has come into the FIFO buffer is maintained in the last stage fiber loop memory M4 and a new signal comes into the first stage traffic control unit S1. In this case, the new incoming signal is transmitted to the first input terminal I1 of the fourth stage traffic control unit S4 via the traffic control units S1 through S3 because no signals are fed back to the second input terminals I2 of these traffic control units so that the cross transmission functions are performed in such traffic control units. By receiving the new incoming signal with the first input terminal I1, the connection configuration of the forth stage traffic control unit S4 is set to the state corresponding to the parallel transmission function, because the signal held in the last stage fiber loop memory M4 is supplied to the second input terminal I2 of the fourth stage traffic control unit S4. As a result, the new incoming signal is fed back to the second input terminal I2 of the third stage traffic control unit S3, whereby the connection configuration of the third stage traffic control unit S3 is changed to the state corresponding to the parallel transmission function. After this, the signal circulates in the third stage fiber loop memory M3. When the continued device is ready for accepting the signal, the control unit 4 deactivates the wait signal, whereby the connection configuration of the last stage traffic control unit S5 is set to the state corresponding to the cross transmission function. As a result, the signal which was held in the fiber loop memory M4 is picked up and supplied to the continued device via output line 5. After which, no signal is supplied to the second input terminal I2 of the traffic control unit S4 so that the connection configuration of traffic control unit S4 is set to the state corresponding to the cross transmission function, whereby the signal which has been held in the fiber loop memory M3 is introduced into the last stage fiber loop memory M4. At this time, in the case where the continued device can accept the new signal, the last stage traffic control unit maintains the connection configuration corresponding to the cross transmission function, whereby the incoming signal coming from the fiber loop memory M3 passes through the last stage traffic control unit S5, and is supplied to the continued device via output line 5. In contrast, in the case where the continued device cannot accept the new signal, the wait signal is supplied to the second input terminal I2 of the last stage traffic control unit S5, whereby the connection configuration of the last stage traffic control unit S5 is changed to the state corresponding to the parallel transmission function. As a result, the new incoming signal from the fiber loop memory M3 circulates in the last stage fiber loop memory M4.

Figure 4:
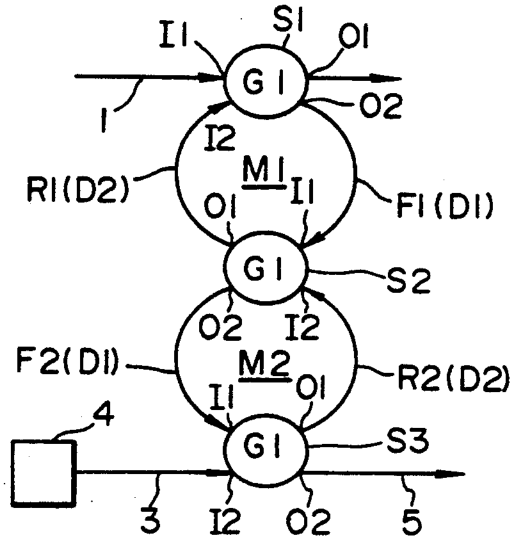
FIG. 4 is a block diagram of the FIFO buffer which has two fiber loop memories.

Next, the signal transmission operation of each portion of this FIFO buffer will be described in detail with reference to FIG. 5, in which, for instance, an operation is described with respect to the case in which the stage number of the fiber loop memories is two, as shown in FIG. 4. In FIG. 4, the traffic control unit S3 is the last stage 2×2 optical stage and the fiber loop memory M2 is the last stage fiber loop memory.

For this FIFO buffer, plural packet cells having a constant duration are continuously supplied as input signals, wherein each packet cell is supplied to the FIFO buffer when the guard time G2 elapses after the preceding packet cell has been supplied. The length of this guard time G2 is determined based on the response time of each traffic control unit. By adjusting the guard time G2, in each traffic control unit, the head of a new incoming packet cell and the head of a preceding packet cell are simultaneously supplied to the input terminals I1 and I2.

Figure 5:
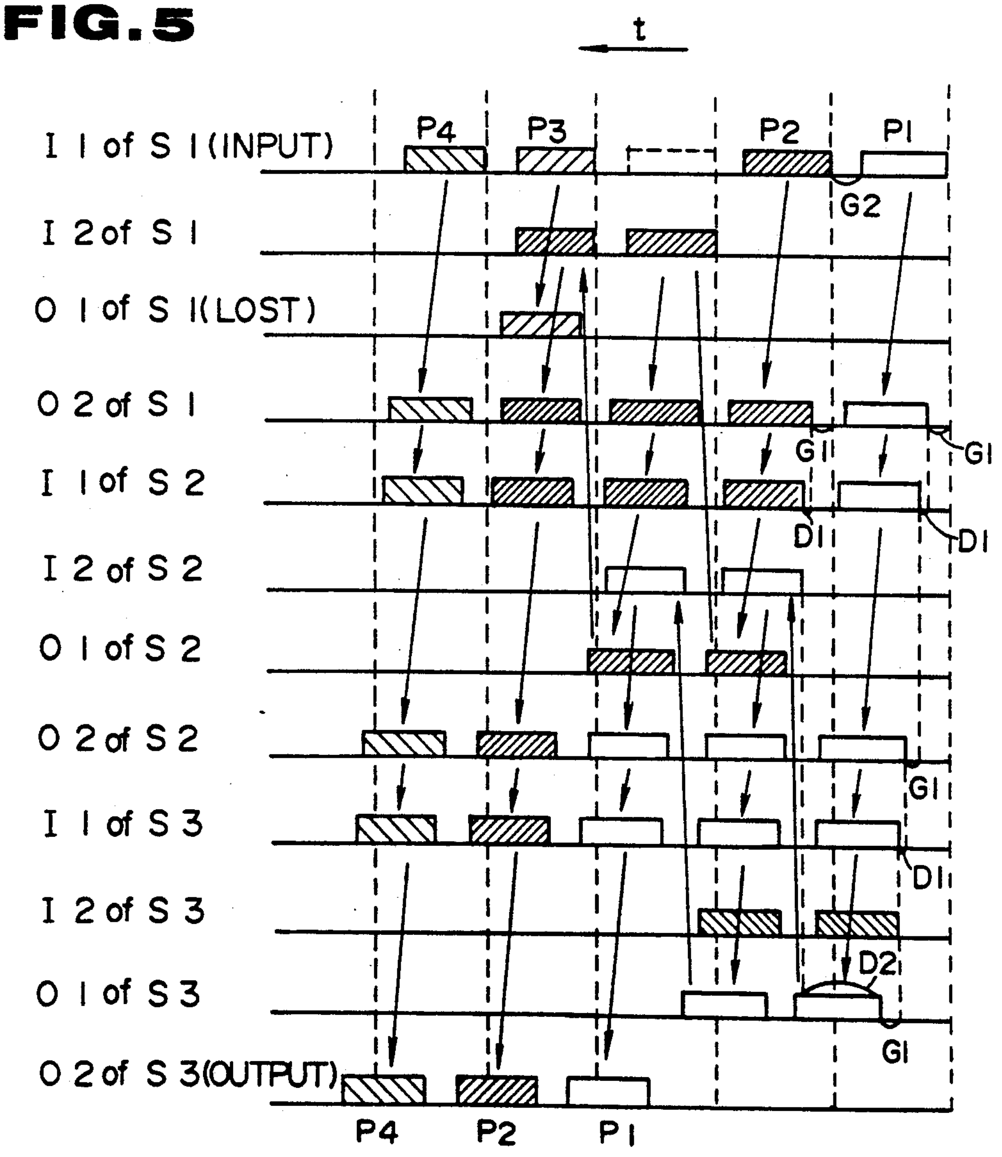
FIG. 5 is a time chart showing the operation of the FIFO buffer shown in FIG. 4.

Suppose that a series of packet cells P1 through P4 are sequentially supplied to the FIFO buffer, as shown in FIG. 5. In this case, the packet cell P3 is supplied to the FIFO buffer when the interval 2L for transmitting two packet cells elapses after the packet cell P2 is supplied thereto. In addition, suppose that when new packet cells come into the first stage traffic control unit, the continued device cannot accept the new packet cell.

First of all, when the first packet cell P1 is supplied to the input terminal I1 of the first stage traffic control unit S1, the packet cell P1 is transmitted to the second output terminal O2, after which the packet cell P1 is outputted therefrom because no signal is supplied to the second input terminal I2, i.e., no packet cell is held in the first stage fiber loop memory M1. In this case, a response time G1 is necessary for transmitting the packet cell G1 to the second output terminal O2 from the first input terminal I1. The guard time G2 mentioned above must be longer than this response time G1. The packet cell P1 outputted from the first stage traffic control unit S1 is transmitted to the first input terminal I1 of the second stage 2×2 optical switch S2 via the fiber delay line F1 having propagation delay time D1. The packet cell P1 is outputted from the second stage traffic control unit S2 when the response time G1 elapses after the packet cell P1 has come thereto, after which the packet cell P1 is transmitted to the third stage traffic control unit S3. At that time, the wait signal is being supplied to the second input terminal I2 of the third stage traffic control unit S3 so that the packet cell P1 is outputted from the first output terminal O1 (response time G1), after which the output packet cell P1 is fed back to the second input terminal I2 of second stage traffic control unit S2 via the fiber delay line R2 having propagation delay time D2. On the other hand, the second packet cell P2 is supplied to the first stage traffic control unit S1 when the packet period L elapses after the first packet cell has been supplied thereto. The second packet cell P2 is transmitted to the first input terminal I1 of the second stage traffic control unit S2 via the first stage 2×2 optical switch S1 (response time G1) and the fiber delay line F1 (propagation delay time D1).

Herein, the input timings of packet cells P1 and P2 will be considered. The head of the first packet cell P1 is supplied to the traffic control unit S2 at the time when the transmission delay time for packet cell P1, i.e., 3G1+2D1+D2 elapses after the first packet cell P1 has come into the first stage traffic control unit S1. In contrast, the head of second packet cell P1 is supplied to the traffic control unit S2 at the time when the transmission delay time for packet cell P2, i.e., G2+G1+D1 elapses after the second packet cell P2 has come into the first stage traffic control unit S1. In this case, the second packet cell P2 comes into the first stage traffic control unit S1 at the time when the packed period L elapses after the first packet cell P1 has come thereto. Thus, the second packet cell comes into the second stage traffic control unit S2 at the time when the interval L+G2+G1+D1 elapses after the first packet cell P1 has come into the first stage traffic control unit S1. In order to adjust the input timing of two packet cells P1 and P2 such that the packet cell P2 is simultaneously supplied to the traffic control unit S2 when the packet cell P1 is supplied thereto, the following condition must be satisfied.

$$D1+D2+2G1=L+G2 \quad \text{(Eq. 1)}$$

In the case where D1+D2=L, i.e., the total propagation time of the fiber delay lines which constitute unit fiber loop memory equals the packet period L, the above condition (Eq. 1) is satisfied by setting the guard time G2 to G2=2G1.

The connection configuration of the second stage traffic control unit S2 is set to the state corresponding to the parallel transmission function because both input terminals of the second stage traffic control unit S2 are supplied signals. As a result, the first packet cell P1 is fed back to the second stage traffic control unit S2 via the fiber delay line F2 (propagation delay time D1), the third stage traffic control unit S3 (response time G1) and the fiber delay line R2 (propagation delay time D2). In contrast, the second packet cell P2 outputted from the second stage traffic control unit S2 is fed back thereto via the fiber delay line R1 (propagation delay time D2), the first stage traffic control unit S1 (response time G1), and the fiber delay line F1 (propagation delay time D1). That is, the period for circulating the packet cell P1 in the fiber loop memory M1 and the period for circulating the packet cell P2 in fiber loop memory M2 are of the same duration D1+D2+2G1. Accordingly, two packet cells which have the same phase angle are simultaneously supplied to the first and second input terminals of the traffic control units.

The first packet cell P1 outputted from the second stage traffic control unit S2 is supplied to the third stage traffic control unit S3 via the fiber delay line F2. In the case where the wait signal is not supplied to the second input terminal I2 of the third stage traffic control unit S3 when the packet cell P1 is supplied to the first input terminal I1 of the third stage traffic control unit S3, the first packet cell P1 is outputted from the second output terminal O2, after which the output packet cell P1 is supplied to the continued device via output line 5. In addition, the second packet cell outputted from the second stage traffic control unit S2 is supplied to the first stage traffic control unit S1 again, after which the packet cell P2 is supplied to the continued device because no signal is supplied to the second input terminals of traffic control units S2 and S3. Next, the third packet cell P3 is supplied to the FIFO buffer, however, this packet cell P3 comes into the first stage traffic control unit S1 while the preceding packet cell P2 is circulating in the first stage fiber loop memory M1 so that the packet cell P3 is lost. The forth packet cell P4 is transmitted to the continued device via the traffic control units S1 through S3 and fiber delay lines, since no previous packet cells are held in the fiber loop memories M1 and M2. As a result of the above-described processing, the packet cells P1, P2, and P4 are sequentially supplied to the continued device.

Figure 6:
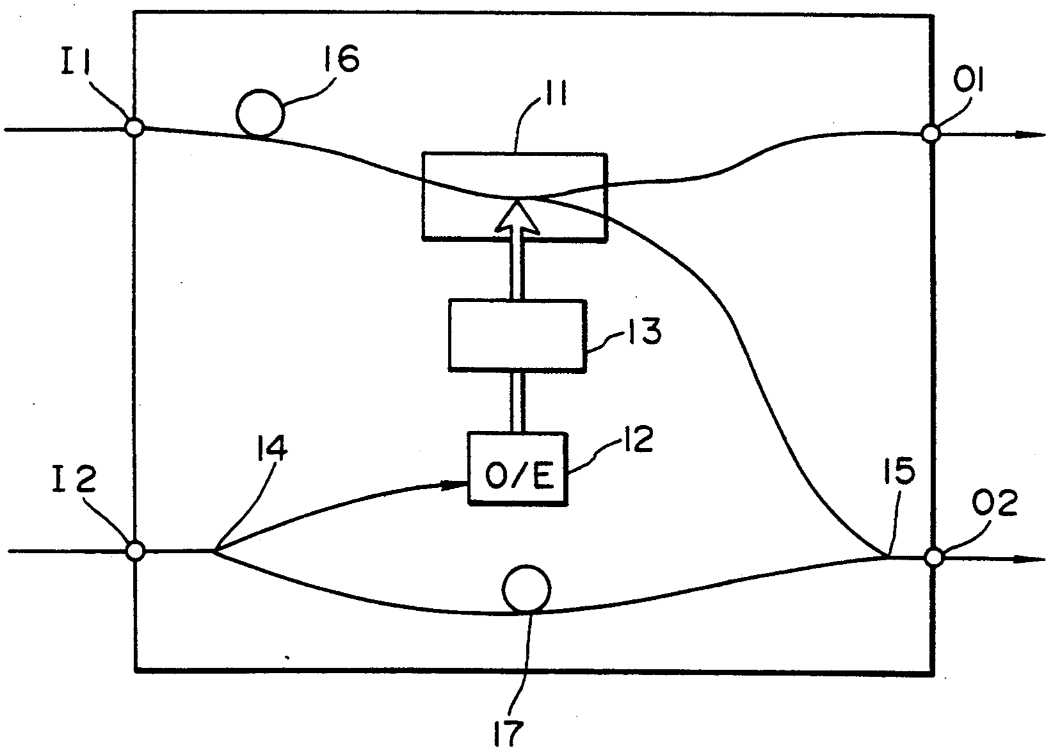
FIG. 6 is a block diagram showing the configuration of a traffic control unit used for the FIFO buffer shown in FIG. 1.

FIG. 6 is a block diagram showing a configuration of a traffic control unit used for the first preferred embodiment. In FIG. 6, 11 designates a 1×2 optical switch; 12 designates a light sensor; 13 designates a mono-stable multi-vibrator; 14 designates a light splitter; 15 designates a optical coupler; and 16 and 17 designate optical delay lines for timing adjustment.

Hereinafter, the operation of this traffic control unit will be described. In the case where a signal comes into the input terminal I1, the incoming signal is transmitted to the input terminal of the 1×2 optical switch 11 via optical delay line 16. On the other hand, in the case where a signal comes into the input terminal I2, the incoming signal is inputted to the light splitter 14, whereby the input signal is divided into two signals. One of the output signals obtained from the light splitter 14 is supplied to the light sensor 12, whereby the optical signal is converted to an electronic signal, after which the obtained electronic signal triggers the mono-stable multi-vibrator 13. Another output signal of the light splitter 14 is delayed by the optical delay line 17, after which the delayed signal is transmitted to the output terminal O2 via the optical coupler 15. When the mono-stable multi-vibrator 13 is triggered by the electronic signal, the mono-stable multi-vibrator 13 outputs a pulse signal having a duration which is determined based on the time constant of a time constant circuit provided in the mono-stable multi-vibrator. While the pulse signal obtained from the mono-stable multi-vibrator 13 is active, the signal path between the input terminal and the first output terminal in the 1×2 optical switch 11 is in effect. As a result, the incoming signal delayed by the optical delay line 16 passes through the 1×2 optical switch 11, after which the incoming signal is transmitted to the first output terminal O1. The propagation delay times of the optical delay lines 16 and 17 are designed such that two signals which have been simultaneously supplied to the first and second input terminals I1 and I2 are simultaneously obtained from the first and second output terminals O1 and O2. In this manner, the parallel transmission state mentioned above is established. When the predetermined interval elapses after the mono-stable multi-vibrator 11 has been triggered, the pulse signal is deactivated, whereby the incoming signal from the optical delay line 16 is transmitted to the second output terminal O2, i.e., the cross transmission state mentioned above is established. The duration of the pulse signal generated by the mono-stable multi-vibrator 13 depends on the time length of the packet cells such that the connection configuration of the 1×2 optical switch 11 is not changed while the packet cell is passing through the 1×2 optical switch 11, whereby the complete packet cell is inputted to the input terminal of the 1×2 optical switch 11, and is outputted from one of the output terminals of the 1×2 optical switch 11.

By the above description, the operation of the traffic control unit can be clearly understood as follows.

(a) In the case where two incoming signals are supplied to the first and second input terminals I1 and I2, the incoming signals are respectively outputted from the first and second output terminals O1 and O2 (parallel transmission function).

(b) In the case where a signal is inputted to only the first input terminal I1, the incoming signal is subsequently outputted from the second output terminal O2 (cross transmission function).

(c) In the case where a signal is inputted into only the second input terminal I2, the incoming signal is subsequently outputted from the second output terminal O2.

In the case of the last stage traffic control unit S3 shown in FIG. 4, the elements 12 through 14 and 17 are not necessary, and the wait signal supplied from the control unit 4 shown in FIG. 1 is directly supplied to the 1×2 optical switch 11. In this case, the incoming signal supplied to the first input terminal I1 is transmitted to either output terminal O2 or O1 based on the judgement as to whether the continued device can accept signals or not.

In the traffic control unit shown in FIG. 6, the 1×2 optical switch 11 is the electronic controlled switch in which connection configuration is switched by electronic signals so that a long response time is required for the switching. Accordingly, in the case where the 2×2 switch shown in FIG. 6 is used for the FIFO buffer, the guard time G2 must be sufficiently long so that the throughput of the FIFO buffer is restricted. However, the 1×2 optical switch 11 can be replaced by an optically controlled type switch in which connection configuration is switched by optical signals. In this case, the throughput of the FIFO buffer can be improved. In addition, the wavelength multiplication technique can be applied to the FIFO buffer. By using this technique, plural packet cells are transmitted through the FIFO buffer in a parallel manner, wherein the wavelength of each packet cell is different from the wavelength of the other packet cells. Accordingly, the throughput of the FIFO buffer can be greatly improved.

B. Second Preferred Embodiment

Figure 7:
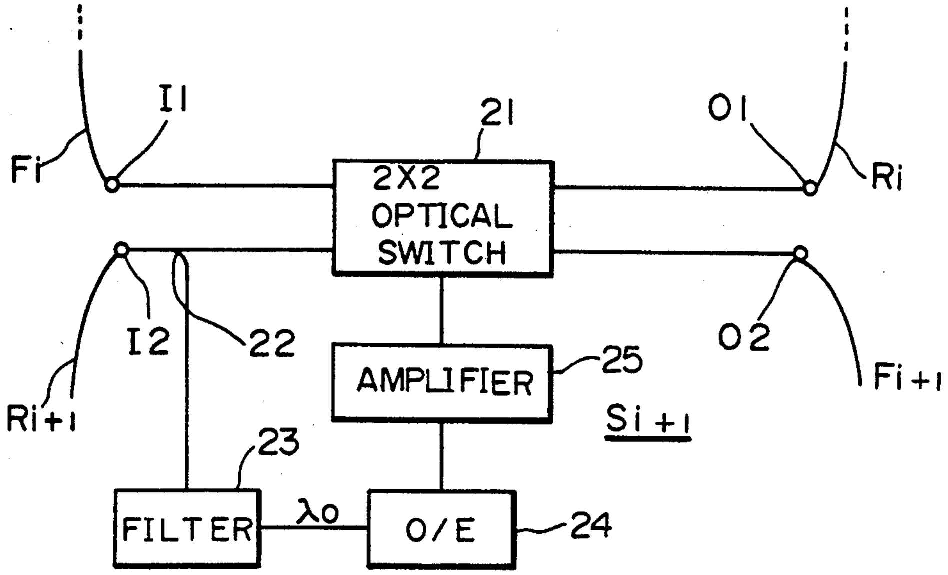
FIG. 7 is a block diagram showing the configuration of a traffic control unit used for the second preferred embodiment of the present invention.

FIG. 7 is a block diagram showing the configuration of the traffic control unit used for the second preferred embodiment. In FIG. 7, 21 designates a 2×2 optical switch in which connection configuration is switched based on electronic signals; 22 designates a light splitter which divides the incoming packet cells supplied to the second input terminals I2; 23 designates a filter which selects and outputs optical signals having wavelength $\lambda_0$ included in the signal obtained from the light splitter 22; 24 designates a light sensor which converts optical signals to electronic signals; and 25 designates an electronic amplifier.

In the second preferred embodiment, a unit packet cell to be transmitted includes plural data signals having different wavelengths $\lambda_1$ through $\lambda_n$, and a control signal having wavelength $\lambda_0$, wherein the data signals and control signal have the same duration and the control signal indicates that the data signals are in effect.

When no signal is supplied to the input terminal I1, the connection configuration of the 2×2 optical switch 21 is set to the state corresponding to the cross transmission function as described above, whereby the incoming packet cell introduced into the input terminal I1 is transmitted to the output terminal O2 via the 2×2 optical switch. In contrast, the packet cell is fed back from the next stage and is supplied to the input terminal I2; the packet cell is divided into two signals by the light splitter 22. One of the signals obtained from the light splitter 22 is supplied to the second input terminal of the 2×2 optical switch 21. On the other hand, another signal obtained from the light splitter 22 is supplied to the filter 23, whereby the control signal which has wavelength $\lambda_0$ is selected and outputted. The output signal of filter 23 is converted to the electronic signal by the optical acceptor 24, after which an electronic signal is supplied to the 2×2 optical switch 21, whereby the connection configuration of the 2×2 optical switch 21 is changed to the state corresponding to the parallel transmission function as described above. The electronic signal is active while a portion of the packet cell introduced into the second input terminal I2 is detected by the filter 23 so that all of the packet cell can pass through the 2×2 optical switch 21 and be transmitted to the output terminal O2. In addition, in the case where the new packet cell is simultaneously introduced into the input terminal I1 when the preceding packet cell is introduced into the input terminal I2, all of new packet cell can pass through the 2×2 optical switch and be transmitted to the first output terminal O1 because the new packet cell and the preceding packet cell have the same duration.

Figure 8:
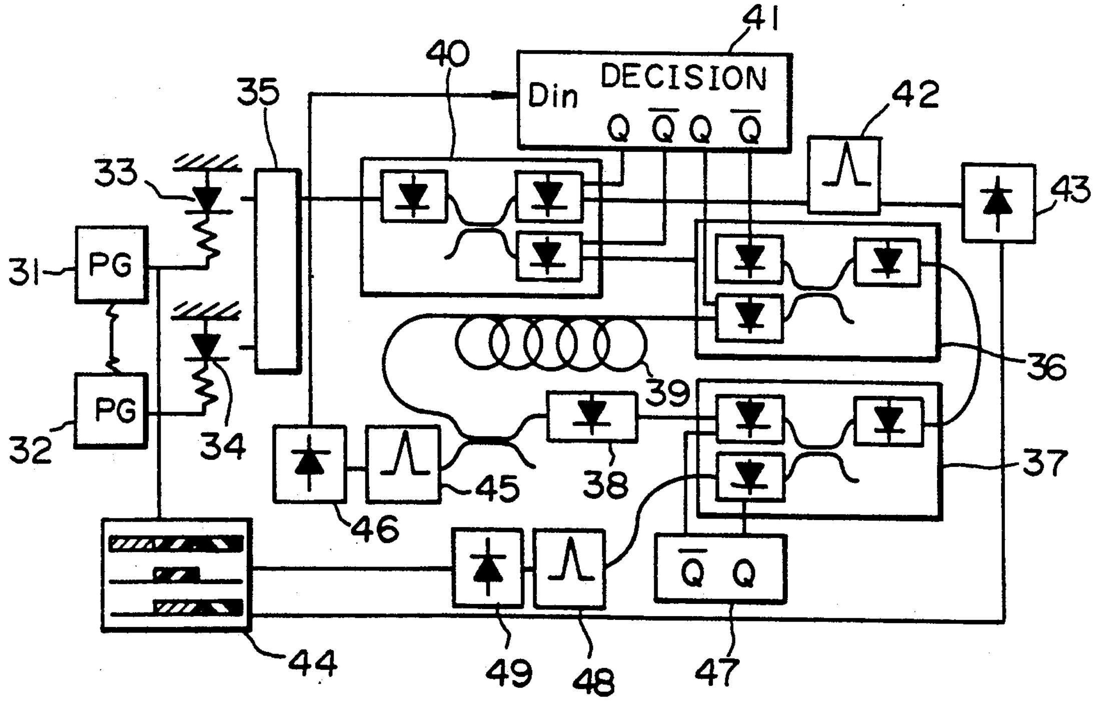
FIG. 8 is a block diagram showing the experimental circuit used for the experiment which was performed in order to evaluate the performance of the FIFO buffer according to the second preferred embodiment of the present invention.

In order to evaluate the performance of the FIFO buffer according to the second preferred embodiment of the invention, the following experiment was performed using the experimental circuit shown in FIG. 8.

In FIG. 8, 31 and 32 designate pulse generators which generate pulse signals, wherein one of the pulse signals is synchronization with the other. The output pulse signals of the pulse generator 31 and 32 have the same period corresponding to 50-bit data having a bit rate of 1 [Gps]. The output signal of pulse generator 31 is displayed on a oscilloscope 44. DFB-LD (Distributed Feed-Back Laser Diode) 33 and 34 are respectively driven by the pulse generators 31 and 32. The DFB-LDs 33 and 34 respectively emit the optical signals, wherein the optical signal obtained from the DFB-LD 33 has the wavelength $\lambda_1 = 1.31$ [micrometers] and the optical signal obtained from the DFB-LD 34 has the wavelength $\lambda_0 = 1.30$ [micrometers]. Two gate switches 36 and 37, an amplifier 38, and a fiber delay line 39, constitute the unit stage fiber loop memory. The amplifier 38, which is a TWT (Traveling-Wave Type) amplifier, is inserted in order to control the loop gain of the unit fiber loop memory. The output signal of mixer 35 is supplied to a gate switch 40 having two output terminals. The connection configuration of gate switch 40 is controlled based on the output signals supplied from an input control unit 41, whereby the output signal of mixer 35 is supplied to either a filter 42 for picking up signals having the wavelength 1.31 [micrometers] or to the unit fiber loop circuit. The optical signals picked up by the filter 42, i.e., the optical signals which are not introduced to the fiber loop memory and are lost are converted to electronic signals by a photodetecting diode 43. The electronic signals obtained from the photodetecting diode 43 are displayed on the oscilloscope 44. Optical signals circulating in the fiber loop memory are picked up and supplied to a filter 45 for picking up signals having wavelength $\lambda_0 = 1.30$ [micrometers]. The optical signals obtained from the filter 45 are converted to electronic signals by a photodetecting diode 46. The output signals obtained from the input control unit 41 are determined based on whether or not electronic signals are obtained from the photodetecting diode 46, whereby in the case where no signal is obtained from the photodetecting diode 46, i.e., no signal circulates in fiber loop circuit, the optical signals obtained from mixer 35 are introduced into the fiber loop circuit. The connection configuration of gate switch 37 is controlled by an output control unit 47. In this case, the output control unit 47 is designed such that a first packet cell is not outputted from the fiber loop memory and the next two packet cells are outputted from the fiber loop memory. The optical signals outputted from the fiber loop memory are supplied to a filter 48 for picking signals having the wavelength $\lambda_1 = 1.31$ [micrometers]. The optical signals obtained from the filter 48 are converted to electronic signals by a photodetecting diode 49, after which the obtained electronic signals are displayed on the oscilloscope 44.

Figure 9:
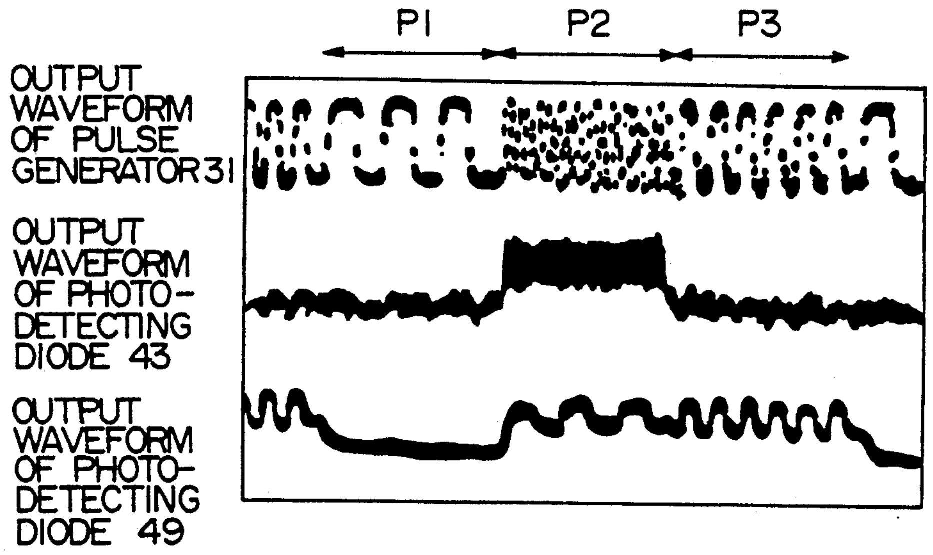
FIG. 9 shows the results of experiment performed using the experimental circuit shown in FIG. 8.

FIGS. 9 shows the results of the experiment. In the experiment, input packet cells P1 through P3 which respectively consist of repeated 1/0 patterns are generated by the pulse generator 31 and supplied to the gate switch 40, as shown in FIG. 9, wherein the length of each 1 or 0 is 8 bits in the case of packet call P1 and the length of which is 4 bits in case of packet call P2. As a result of the experiment, the packet cells P1 and P3 are outputted from the fiber loop memory and observed as output signals by photodetecting diode 49, while the packet cell P2 is lost and observed as an output signal of the photodetecting diode 43, i.e., a desirable result is obtained.

C. Third Preferred Embodiment

Figure 10:
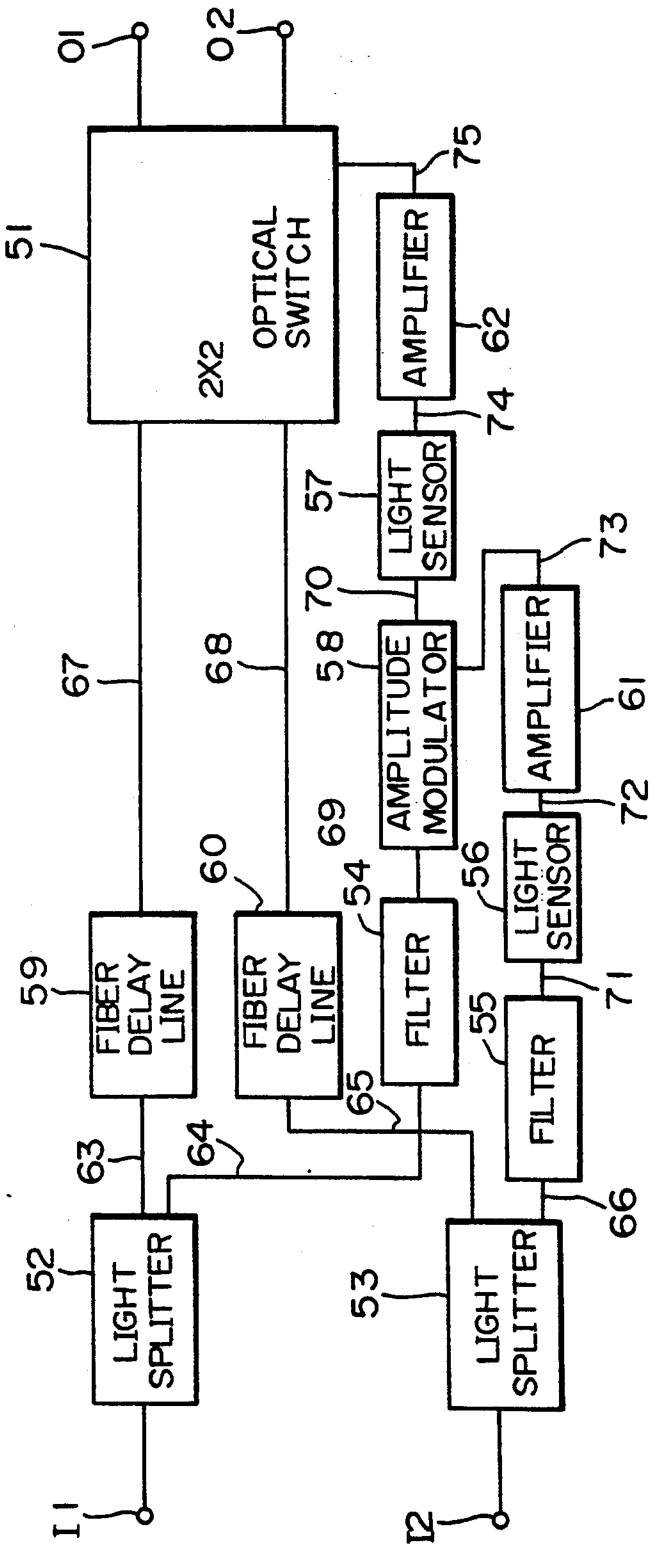
FIG. 10 is a block diagram showing the configuration of a traffic control unit used for the third preferred embodiment of the present invention.

FIG. 10 is a block diagram showing the configuration of the traffic control unit used for the third preferred embodiment. In FIG. 10, 51 designates a 2×2 optical switch in which connection configuration is switched based on electronic signals; 52 and 53 designate light splitters which respectively divide the incoming packet cells supplied to the first and second input terminals I1 and I2; 54 designates a filter which selects and outputs optical signals having wavelength $\lambda_0$ included in one of the output packet cells obtained from the light splitter 52; 55 designates a filter which selects and outputs optical signals having wavelength $\lambda_1$ included in one of the output packet cells obtained from the light splitter 53; 56 and 57 designate light sensors which convert optical signals to electronic signals; 58 designates a normally-on type amplitude modulator; 59 and 60 designate fiber delay lines which respectively transmit the output signals of the light splitters 52 and 53 to the first and second input terminals of 2×2 optical switch 51; 61 and 62 designate electronic amplifiers; 63 through 71 designate optical signal lines; and 72 through 75 designate electronic signal lines.

In the above-described configuration, $\lambda_0$ may be different from $\lambda_1$, or $\lambda_0$ may be equal to $\lambda_1$.

When no signal is supplied from the electronic amplifier 62, the connection configuration of the 22×2 optical switch 51 is set to the state corresponding to the parallel transmission function described above, whereby the input signal which is supplied to the first input terminal I1 is transmitted to the first output terminal O1 via the light splitter 52, and to fiber delay line 59 and 2×2 optical switch 51, and also whereby the input signal which is fed back from the next stage to the second input terminal I2 is transmitted to the output terminal O2 via the light splitter 53, fiber delay line 60, and 2×2 optical switch 51. Each packet cell supplied to the FIFO buffer includes a data signal, first control signal, and second control signal. The first control signal has wavelength $\lambda_0$ and is synchronized with the data signal. Similarly, the second control signal has wavelength $\lambda_1$ and is synchronized with the data signal. A packet cell supplied from the neighboring stage to the input terminal I1 is divided by the light splitter 52, after which one of the divided signals is supplied to the filter 54, whereby the first control signal having wavelength $\lambda_0$ is selected and outputted on the optical signal line 69. On the other hand, the packet cell fed back from the next stage to the input terminal I2 is divided by the light splitter 53, after which one of the divided signals is supplied to the filter 55, whereby the second control signal having wavelength $\lambda_0$ is selected and outputted on the optical signal line 71.

Hereinbelow, a case in which a packet cell is supplied from the neighboring stage only to the first input terminal I1 is considered. In this case, the amplitude modulator 58 is in the on-state. Since, no signal is supplied to the second input terminal I2, no signal is supplied to the modulation input terminal of amplitude modulator 58. The input packet cell is transmitted to the first input terminal of the 2×2 optical switch 51. On the other hand, the first control signal is obtained from the input packet cell as described above. The first control signal is transmitted to the light sensor 57 via the amplitude modulator 58 which is in the on-state, whereby the light sensor 57 generates an electronic pulse which is triggered in synchronization with the head of the input packet cell and which has a duration equals to that of the input packet cell. The generated pulse is supplied to the 2×2 optical switch 51 via the amplifier 62. As a result, connection configuration of the 2×2 optical switch 51 is set to the state corresponding to the cross transmission function, whereby the input packet cell is transmitted to the second output terminal O2 via the 2×2 optical switch. When the transmission of the packet cell has been completed, the first control signal cannot be detected by the filter 54, whereby the connection configuration of the 2×2 optical switch 51 is changed to the state corresponding to the parallel transmission function.

Next, a case is considered in which a packet cell is fed-back from the next stage to the second input terminal O2. The fed-back packet cell is transmitted to the second input terminal of the 2×2 optical switch 51. On the other hand, the second control signal is obtained from the fed-back packet cell as described above. The second control signal is supplied to the light sensor 56, whereby the light sensor 56 generates an electronic pulse which is triggered in synchronization with the ged back packet cell and has a duration equal to that of the fed-back packet cell, after which the generated pulse is supplied to the modulation input terminal of amplitude modulator 58. As a result, the amplitude modulator is changed to the off-state, whereby no signal is outputted from the amplitude modulator 58 even if the first control signal which indicates the arrival of the input packet cell is supplied to the amplitude modulator 58. Thus, the connection configuration of the 2×2 optical switch 51 maintains the state corresponding to the parallel transmission function while the fed-back packet cell supplied to the input terminal I2 is in effect, whereby all of the fed-back packet cell is completely transmitted to the second output terminal O2 via the 2×2 optical switch 51. In addition, in the case where the new incoming packet cell is simultaneously supplied to the first input terminal I1 when the fed-back packet cell is supplied to the second input terminal I2, the connection configuration of the 2×2 optical switch 51 is set to the state corresponding to the parallel transmission function, whereby the input packet cell is fed-back to the neighboring stage which supplies the input packet cell, while the fed back packet cell is supplied to the next stage again.

D. Fourth Preferred Embodiment

Figure 11:
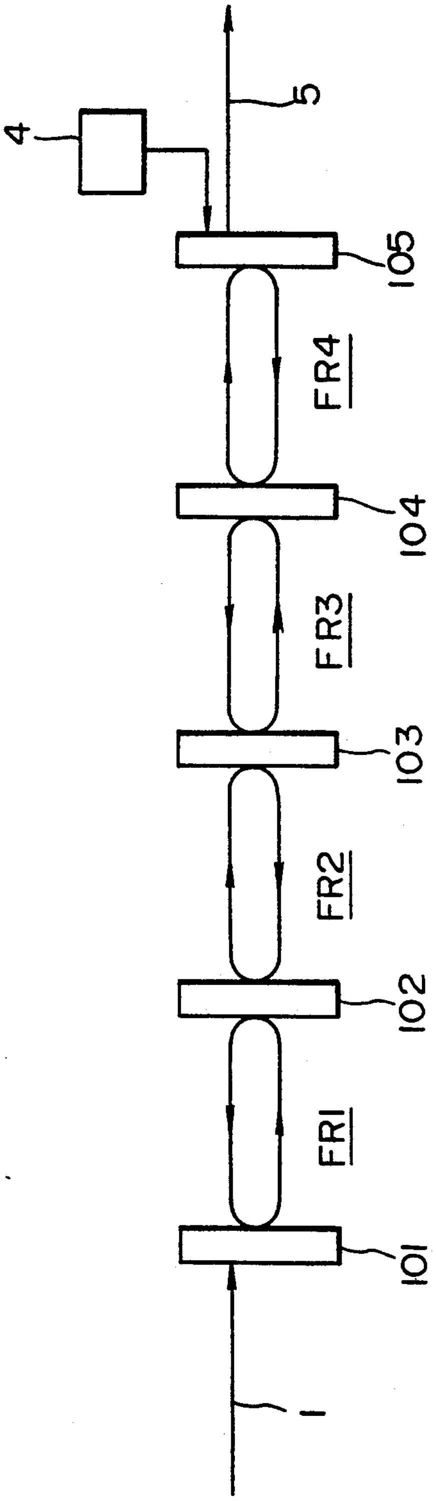
FIG. 11 a block diagram showing the configuration of a FIFO buffer according to the forth preferred embodiment of the present invention.
Figure 12:
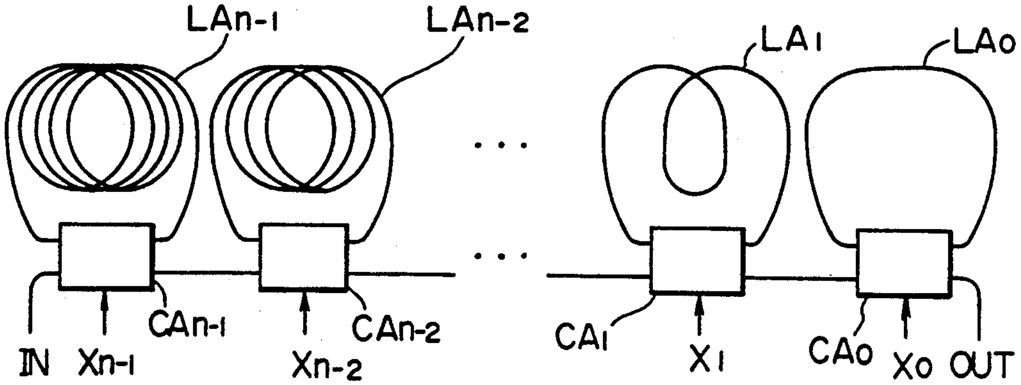
FIG.12 PRIOR ART
FIG. 12 is a block diagram showing the configuration of a conventional delay circuit.
Figure 13:
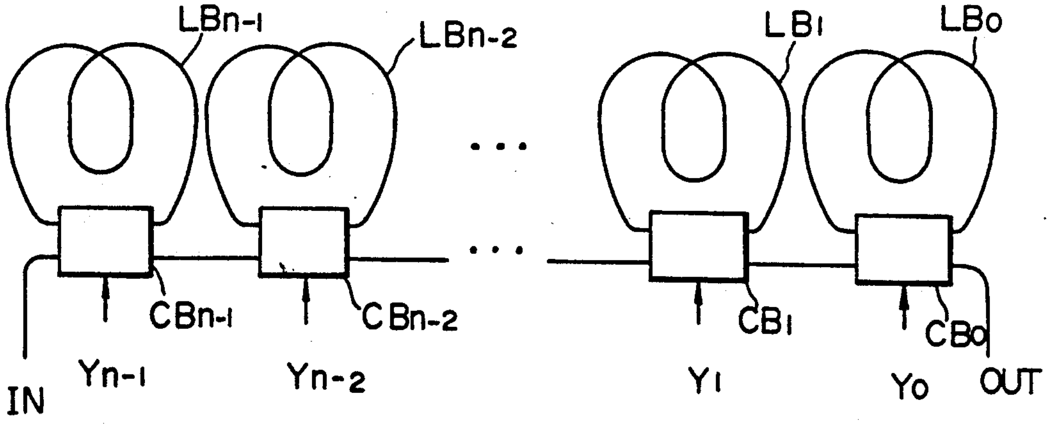
FIG.13 PRIOR ART
FIG. 13 is a block diagram showing the configuration of a conventional FIFO buffer.

FIG. 11 is a block diagram showing a configuration of the FIFO buffer according to the fourth preferred embodiment of the invention. In FIG. 11, 101 through 105 respectively designate variable-direction-type half-mirrors. Two neighboring half-mirrors constitute a Fabri-Pero resonator. The Fabri-Pero resonators FR1 through FR4 respectively act as memory cells which correspond to the fiber loop memory used for the first through third preferred embodiments described above. In the case where a packet cell passes through the one stage Fabri-Pero resonator, the packet cell is delayed by the propagation delay time L which is necessary for reciprocating the packet cell once between two neighboring mirrors. In each half-mirror, the reflection ratio of input side surface increases by inputting an optical signal to the output side surface. In the case where the continued device cannot accept packet cells, the wait optical signal is supplied to the output side surface of the last stage mirror.

Hereinafter, the operation of the fourth preferred embodiment will be described. In the case where a preceding packet cell is held in a Fabri-Pero resonator FR4, for example, and a new packet cell arrive at the half-mirror 104, two packet cells are come into the same half-mirror 104. In this case, the heads of the two packet cells reach thereto at the same time, and the two packet cells are reflected by the half-mirror 104; after this, the new packet cell propagates in the Fabri-Pero resonator FR3 in the reverse direction and the preceding packet cell propagates in the Fabri-Pero resonator FR4 along forward direction because the preceding packet cell arrive at the output side surface of the half-mirror 104 so that the reflection ratios of the both side surfaces of the half-mirror 1104 increase. When the preceding packet cell exits the Fabri-Pero resonator FR4 and is supplied to the continued device via output line 5, the new packet cell passes through the mirror 104 and is introduced into the Fabri-Pero resonator FR4 because no signal arrive at the output side surface of the half-mirror 104 so that the pass-through ratio of the half-mirror 104 increases. In the case where no signal comes into the half-mirror 104 and a packet cell is held in the Fabri-Pero resonator FR4 because the wait signal is supplied to the output side surface of the mirror 105, the packet cell arriving at the half-mirror 105 is reflected therefrom and circulates and is held in the Fabri-Pero resonator FR4. In this manner, the FIFO buffer operates.

With this embodiment, all elements are optical elements so that the guard time can be short. Accordingly, a FIFO buffer having a high throughtput is obtained. In the other preferred embodiment, amplifier elements are provided in Fabri-Pero resonators FR1 through FR4. With this embodiment, the signal attenuation occurring in each Fabri-Pero resonator is complemented so that the performance of the FIFO buffer is improved.

In the above-described preferred embodiments, the descriptions are given with respect to the optical FIFO buffers which transmit optical signals. However, the present invention can be applied to an electronic FIFO buffer with a similar configuration. In this case, advantages similar to the advantages obtained from the above-described preferred embodiments may be obtained.

What is claimed is:

1. An FIFO buffer for holding signals and supplying held signals to a device connected thereto, said FIFO buffer comprising:

plural loop means for holding a signal introduced therein via feedback, wherein each loop means includes a delay element, and said plural loop means are connected to one another between an input portion and an output portion in a cascade manner; and plural traffic control means for controlling the signal traffic between said plural loop means, each traffic control means having an input side and an output side connected to the output portion and input portion of respective loop means so that each traffic control means is commonly included in two neighboring loop means, the controlling function of each traffic control means is based on fed back and new signals which come thereto from neighboring loop means on the output side and input side, respectively, whereby in the case where no signal is fed back to said traffic control means from said output side and a new signal is transmitted to said traffic control means from said input side, said traffic control means transmits said new signal to said loop means which is on said output side; in the case where any signal is fed back to said traffic control means from said output side and a new signal is transmitted to said traffic control means from said input side, said traffic control means transmits said fed-back signal to said loop means which is on said output side again and transmits said new signal to said loop means which is on said input side; and in the case where any signal is fed back to said traffic control means from said output side and also no signal is transmitted to said traffic control means from said input side, said traffic control means transmits said fed back signal to said loop means which is on said output side again.

2. An FIFO buffer according to claim 1, wherein said plural loop means include an amplifier element for complementing the attenuation of the signal circulating therein.

3. An FIFO buffer according to claim 1, wherein said plural traffic control means comprising:

(i) 2×2 switch section having:

(a) first and second input terminals, wherein said first input terminal is connected with said loop means which is on said input side and said second input terminal is connected with said loop means which is on said output side;

(b) first and second output terminals, wherein said first output terminal is connected with said loop means which is in said input side and said second output terminal is connected with said loop means which is on said output side;

(ii) connection control section for switching the connection configuration of said 2×2 switch section based on signals which come into said first and second input terminals;

whereby in the case where no signal is supplied to said second input terminal, the path between said first input terminal and said second output terminal is enabled; in the case where a signal is supplied to said second input terminal, the path between the first input terminal and the first output terminal and the path between the second input terminal and the second output terminal are enabled for a predetermined period.

4. An FIFO buffer according to claim 1, said FIFO buffer transmits signals which include data signals and control signals indicating said data signal is in effect, wherein said plural traffic control means comprising:

(i) 2×2 switch section having:

(a) first and second input terminals, wherein said first input terminal is connected with said loop means which is on said input side and said second input terminal is connected with said loop means which is on said output side;

(b) first and second output terminals, wherein said first output terminal is connected with said loop means which is on said input side and said second output terminal is connected with said loop means which is on said output side;

(ii) connection control section for switching the connection configuration of said 2×2 switch section based on signals which come into said first and second input terminals;

whereby in the case where no signal is supplied to said second input terminal and a signal is supplied to said first input terminal, the path between said first input terminal and said second output terminal is enabled; in the case where said signal is supplied to said second input terminal, the path between the first input terminal and the first output terminal and the path between the second input terminal and the second output terminal are enabled while said control signal is detected from said second input terminal.

5. An FIFO buffer according to claim 1, said FIFO buffer transmits signals which include data signals and first and second control signals which indicate said data signals are in effect, wherein said plural traffic control means comprising:

(i) 2×2 switch section having:

(a) first and second input terminals, wherein said first input terminal is connected with said loop means which is in said input side and said second input terminal is connected with said loop means which is on said output side;

(b) first and second output terminals, wherein said first output terminal is connected with said loop means which is on said input side and said second output terminal is connected with said loop means which is on said output side;

(ii) first filter for detecting said first control signal from said first input terminal;

(iii) second filter for detecting said second control signal from said second input terminal; and (iv) connection control section for switching the connection configuration of said 2×2 switch section based on said detected signals from said first and second input terminal, whereby in the case where no signal is detected by said second filter means and said first control signal is detected, the path between said first input terminal and said second output terminal is enabled; in the case where said second control signal is detected, the path between the first input terminal and the first output terminal and the path between the second input terminal and the second output terminal are enabled while said second control signal is detected even if said first control signal is detected.

6. An FIFO buffer for holding signals and supplying held signals to a device connected thereto, said FIFO buffer comprising:

plural memory means for holding signals, said plural memory means connected to one another in a cascade manner; and plural transmission means for transmitting signals between a first and second neighboring memory means, whereby said transmission means transmits signals from said first memory means to said second memory means only in the case where no signal is held in said second memory means.

7. An FIFO buffer for holding input optical signals coming from an input side and supplying held optical signals toward an output side to a device connected thereto, said FIFO buffer comprising:

plural half mirrors which are placed against a line through which said input optical signals propagate so that Fabri-Pero resonators are formed between two neighboring said half mirrors, and the reflection ratio of each half mirror increases in the case where an optical signal is transmitted to the surface of said half mirror which is on said output side; and output control means for supplying a wait optical signal to the output side surface of said half mirror which corresponds to the last stage in the case where said device cannot accept optical signals.

* * * * *